United States Patent
Yamada

(10) Patent No.: US 7,800,953 B2
(45) Date of Patent: Sep. 21, 2010

(54) METHOD AND SYSTEM FOR SELECTIVELY LIMITING PEAK POWER CONSUMPTION DURING PROGRAMMING OR ERASE OF NON-VOLATILE MEMORY DEVICES

(75) Inventor: Shigekazu Yamada, Suginami-ku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/505,909

(22) Filed: Jul. 20, 2009

(65) Prior Publication Data

US 2009/0279376 A1  Nov. 12, 2009

Related U.S. Application Data

(63) Continuation of application No. 11/601,368, filed on Nov. 16, 2006, now Pat. No. 7,567,462.

(51) Int. Cl.
*G11C 11/34* (2006.01)
(52) U.S. Cl. .............................. 365/185.21; 365/185.24
(58) Field of Classification Search ............ 365/185.21, 365/185.24
See application file for complete search history.

(56) References Cited

U.S. PATENT DOCUMENTS

| | | | |
|---|---|---|---|
| 5,218,570 A | 6/1993 | Pascucci et al. ........ 365/189.01 |
| 5,654,918 A * | 8/1997 | Hammick ................ 365/185.2 |
| 5,864,502 A | 1/1999 | Shao-Yi et al. ........ 365/185.21 |
| 6,021,069 A | 2/2000 | Hung et al. ............ 365/185.22 |
| 6,111,791 A * | 8/2000 | Ghilardelli ............. 365/185.28 |
| 6,256,247 B1 | 7/2001 | Perner ........................ 365/209 |
| 6,597,598 B1 | 7/2003 | Tran et al. ...................... 365/94 |
| 6,975,542 B2 | 12/2005 | Roohparvar ........... 365/185.22 |
| 7,126,844 B2 | 10/2006 | Theel .......................... 365/158 |
| 7,254,063 B2 | 8/2007 | Mori ...................... 365/185.22 |
| 7,567,462 B2 | 7/2009 | Yamada ................. 365/185.21 |
| 2005/0083747 A1 | 4/2005 | Tang et al. .................. 365/210 |
| 2005/0207237 A1 | 9/2005 | Isobe .................... 365/189.11 |
| 2006/0098490 A1 | 5/2006 | Mori .................... 365/185.22 |

* cited by examiner

*Primary Examiner*—Michael T Tran
(74) *Attorney, Agent, or Firm*—Dorsey & Whitney LLP

(57) ABSTRACT

A power supply circuit is used to supply power having a limited peak magnitude to an array of non-volatile memory cells during programming or erasing of the memory cells. The power supply circuit includes a reference current source supplying a reference current having a predetermined magnitude. The reference current source is coupled to a current generator, which supplies current to the array. The current generator may use current mirrors, and it supplies a current to the array having a predetermined relationship to the reference current. The current generator is selectively enabled by a control circuit so that current is supplied to the array during programming or erasing of at least some of the memory cells in the array.

37 Claims, 7 Drawing Sheets

METHOD AND SYSTEM FOR SELECTIVELY LIMITING PEAK POWER CONSUMPTION DURING PROGRAMMING OR ERASE OF NON-VOLATILE MEMORY DEVICES

CROSS-REFERENCE TO RELATED APPLICATION

This application is a continuation of U.S. patent application Ser. No. 11/601,368, filed Nov. 16, 2006 and issued as U.S. Pat. 7,567,462 on Jul. 28, 2009. This application and patent is incorporated by reference herein.

TECHNICAL FIELD

This invention relates to memory devices, and, more particularly, to a memory device in which the power consumed by the memory device during programming can be selectively limited in a more controlled manner.

BACKGROUND OF THE INVENTION

Electrically erasable and programmable memory devices having arrays of memory cells are found in a wide variety of electrical devices. For example, a flash memory cell, also known as a floating gate transistor memory cell, is similar to a field effect transistor, having a source region and a drain region that is spaced apart from the source region to form an intermediate channel region. A floating gate, typically made of doped polysilicon, is disposed over the channel region and is electrically isolated from the channel region by a layer of gate oxide. A control gate is fabricated over the floating gate, and it can also be made of doped polysilicon. The control gate is electrically separated from the floating gate by a dielectric layer. Thus, the floating gate is "floating" in the sense that it is insulated from the channel, the control gate and all other components of the flash memory cell.

A flash memory cell is programmed by storing charge on the floating gate. The charge thereafter remains on the gate for an indefinite period even after power has been removed from the flash memory device. Flash memory devices are therefore non-volatile. Charge is stored on the floating gate by applying appropriate voltages to the control gate and the drain or source. For example, negative charge can be placed on the floating gate by grounding the source while applying a sufficiently large positive voltage to the control gate to attract electrons, which tunnel through the gate oxide to the floating gate from the channel region. The voltage applied to the control gate, called a programming voltage, and the duration that the programming voltage is applied as well as the charge originally residing on the floating gate, determine the amount of charge residing on the floating gate after programming.

A flash memory cell can be read by applying a positive control gate to source voltage having a magnitude greater than a threshold voltage. The amount of charge stored on the flash memory cell determines the magnitude of the threshold voltage that must be applied to the control gate to allow the flash memory cell to conduct current between the source and the drain. As negative charge is added to the floating gate, the threshold voltage of the flash memory cell increases. During a read operation, a read voltage is applied to the control gate that is large enough to render the cell conductive if insufficient charge is stored on the floating gate, but not large enough to render the cell conductive if sufficient charge is stored on the floating gate. During the read operation, the drain, which is used as the output terminal of the cell, is precharged to a positive voltage, and the source is coupled to ground. Therefore, if the floating gate of the flash memory cell is sufficiently charged, the drain will remain at the positive voltage. If the floating gate of the flash memory cell is not sufficiently charged, the cell will ground the drain.

Before a flash memory cell can be programmed, it must be erased by removing charge from the floating gate. The cell can be erased by applying a gate-to-source voltage to the cell that has a polarity opposite that used for programming. Specifically, the control gate is grounded, and a large positive voltage is applied to the source to cause the electrons to tunnel through the gate oxide and deplete charge from the floating gate. In another approach, a relatively large negative voltage is applied to the control gate, and a positive voltage, such as a supply voltage, is applied to the source region. As part of the erase process, the flash memory cells undergo an erase verify process. An erase verify process is essentially the same as a normal read procedure.

A typical flash memory device includes a memory array containing a large number of flash memory cells arranged in rows and columns. Two common types of flash memory array architectures are the "NAND" and "NOR" architectures, so called for the logical form in which the basic flash memory cell configuration for each is arranged. FIG. 1 illustrates a typical NAND flash memory array 10 of conventional design. The array 10 is comprised of a large number of flash memory cells, collectively indicated by reference numeral 14. The array of flash memory cells 14 is typically divided into a number of blocks, one of which is shown in FIG. 1. Each block includes a number of rows, which, in the example shown in FIG. 1, includes 32 rows. The cells 14 in the same row have their control gates coupled to a common word select line 30, each of which receives a respective word line signal WL0-WL31. The cells 14 in the same column have their sources and drains connected to each other in series. Thus all of the memory cells 14 in the same column of each block are typically connected in series with each other. The drain of the upper flash memory cell 14 in the block is coupled to a bit line 20 through a first select gate transistor 24. The conductive state of the transistors 24 in each block are controlled by a source gate SG(D) signal. Each of the bit lines 20 output a respective bit line signal BL1-BLN indicative of the data bit stored in the respective column of the array 10. The bit lines 20 extend through multiple blocks to respective sense amplifiers (not shown). The source of the lower flash memory cell 14 in the block is coupled to a source line 26 through a second select gate transistor 28. The conductive state of the transistors 28 in each block are controlled by a source gate SG(S) signal. The source line 26 receives a signal SL having various magnitudes depending upon whether the memory cells 14 are being programmed, read or erased.

A read operation is performed on a row-by-row basis. When a read operation is to be performed for a selected block, the source line 26 is coupled to ground, and the select gate transistors 24, 28 for that block are turned ON responsive to high SG(D) and SG(S) signals. Also, the bit line 20 for each column is precharged to the supply voltage $V_{CC}$. Finally, a read voltage is applied to a word select line 30 for the selected row, thereby applying the read voltage to the control gates of all of the flash memory cells 14 in that row. As explained above, the magnitude of the read voltage is sufficient to turn ON all flash memory cells 14 that do not have a sufficiently charged floating gate, but insufficient to turn ON all cells that have a sufficiently charged floating gate. A voltage having a higher magnitude is applied to the word select lines 30 for all of the non-selected rows. This voltage is large enough to turn ON the flash memory cells 14 even if their floating gates are storing insufficient charge to be read as programmed. As a result, the bit line 20 for each column will be low if the cell 14 in that column of the selected row is not storing enough charge to turn OFF the device at that gate bias. Otherwise the bit line 20 remains high at $V_{CC}$. The voltage on each bit line 20 is compared to a reference voltage by a respective sense amplifier (not shown). If the voltage on the bit line 20 is less than the reference voltage, the sense amplifier outputs a voltage corresponding to a "1" binary value of the read data bit. If the voltage on the bit line 20 is greater than the reference voltage, the sense amplifier outputs a voltage corresponding to a "0" binary value of the read data bit.

When a selected row of flash memory cells 14 are to be erased, the word select line 30 for the selected row is coupled to ground, and the bit lines BL1,2 . . . N for each column is coupled to a large positive voltage. A high SG(D) signal then turns ON the select gate transistors 24 to apply the positive voltage to the drains of the flash memory cells 14. The positive voltage then depletes charge from the floating gates in all of the cells 14, thereby erasing all of the memory cells 14 in the selected row. The flash memory cells 14 are normally erased on a block-by-block basis by grounding the word select lines 30 for all of the cells 14 in the block. Insofar as erasing the cells 14 by depleting charge from their floating gates, erasing the cells 14 effectively programs them to store logic "1" bit values.

When a selected row of cells 14 are to be programmed, a programming voltage is applied to the word select line 30 for the selected row, and a voltage sufficient to turn ON the remaining cells 14 is applied to the control gates of the remaining flash memory cells 14. Also, the first column select transistors 24 are turned ON and voltages corresponding to the data bits that are to be programmed are applied to the respective bit lines. If the voltage of a bit line 20 is at ground corresponding to a logic "0," additional charge will be stored in the floating gate of the flash memory cell 14 in that column of the selected row. Otherwise, a voltage on the bit line 20 corresponding to a logic "1" prevents any additional charge from being stored on the floating gate. Programming is therefore performed on a row-by-row basis.

Conventional flash memory devices generally contain a large number of memory cells 14 in each block. For example, a flash memory device block having 32 rows and 1024 columns of memory cells 14 in each block contains over 32,000 memory cells 14. Since flash memory cells 14 are erased on a block-by block basis, erasing the memory cells 14 in a block entails removing charge from over 32,000 memory cells. Programming the memory cells 14 can also require the transfer of a considerable amount of charge to the memory cells 14. Using the same example of a flash memory device having 1024 columns of memory cells 14, programming a row of memory cells 14 requires simultaneously applying charge to 1024 memory cells 14 since flash memory cells 14 are programmed on a row-by-row basis. As a result, the peak current consumed by a flash memory device during erase and/or programming can be considerable. The peak current consumption during the erase verify process can also be excessive, and can further result in a large amount of power being consumed over a considerable period. The problem of excessive power being consumed by flash memory devices can even be more serious in high data capacity applications where several flash memory devices are used in parallel and may be erased and/or programmed together.

Manufacturers of flash memory devices have taken steps to alleviate the problem of excessive peak power consumption. One conventional approach is to delay the rate at which current is applied to the memory cells 14 while they are being erased and/or programmed. This approach reduces the speed at which flash memory devices can be erased and programmed, but many users prefer limited peak power consumption over increased operating speed. An example of a conventional approach for delaying the rate at which current is applied to flash memory cells to limit peak power consumption is shown in FIG. 2. A power limiting circuit 40 includes an NMOS transistor 42 that has its drain coupled to a large positive voltage $V_{CC}$. The source of the transistor 42 is coupled to one of the bit lines ("BL") 20 (FIG. 1), and the gate of the transistor is coupled to a control circuit 46. The bit line 20 is also connected to the select gate transistor 24 (FIG. 1) in each of the respective blocks. Although only one transistor 42 connected to one bit line 20 is shown in FIG. 2, it will be understood that a respective transistor 42 is provided for each column, and its source is connected to the bit line 20 for that column.

The control circuit 46 includes an inverter 50 coupled through a resistor 52 to the gate of the transistor 42. The inverter 50 is powered by a voltage HV having a magnitude that is greater than that of the voltage $V_{CC}$ by at least the threshold voltage of the transistor 42. As a result, when the output of the inverter 50 is high responsive to an active low ERASE* signal, the transistor 42 can couple the full magnitude of $V_{CC}$ to the bit line BL. A capacitor 56 coupled to either ground or a negative supply voltage $V_{SS}$ causes the output of the inverter 50 to be low-pass filtered. As a result, when the output of the inverter 50 transitions high responsive to the low ERASE* signal, the gate of the transistor 42 transitions high relatively slowly with a time constant corresponding to the product of the resistance of the resistor 52 and the capacitance of the capacitor 56. As a result, the peak current applied to the bit line BL is relatively low. Insofar as some users prefer faster programming time over reduced peak power consumption, the ERASE* signals may be coupled to the inverter 50 through a fuse or anti-fuse 58 to allow a user to select either the reduced peak power consumption mode or the fast programming mode.

Although not shown in FIG. 2, control circuits in a flash memory device using the power limiting circuit 40 increase the erase and/or programming times when the user selects the reduced peak power consumption mode to allow sufficient charge to be coupled to or from the floating gates of the memory cells 14.

The power limiting circuit 40 shown in FIG. 2 is adequate in many circumstances. However, the circuit 40 does not provide good control over the magnitude of the peak power drawn by the bit lines BL. As shown in FIG. 3, the bit line current provided by the power limiting circuit 40 is not very constant, and has a peak value that is difficult to control. In particular, changes in temperature or process variations can allow the peak power consumed to vary significantly. Therefore, the conventional power limiting circuit 40 can sometimes allow excessive power to be consumed.

There is, therefore, a need for a flash memory device that can be selectively enabled and that provides better control over the peak power consumed by memory cells during programming and/or erase, including during erase verification.

DETAILED DESCRIPTION

Figure 4:
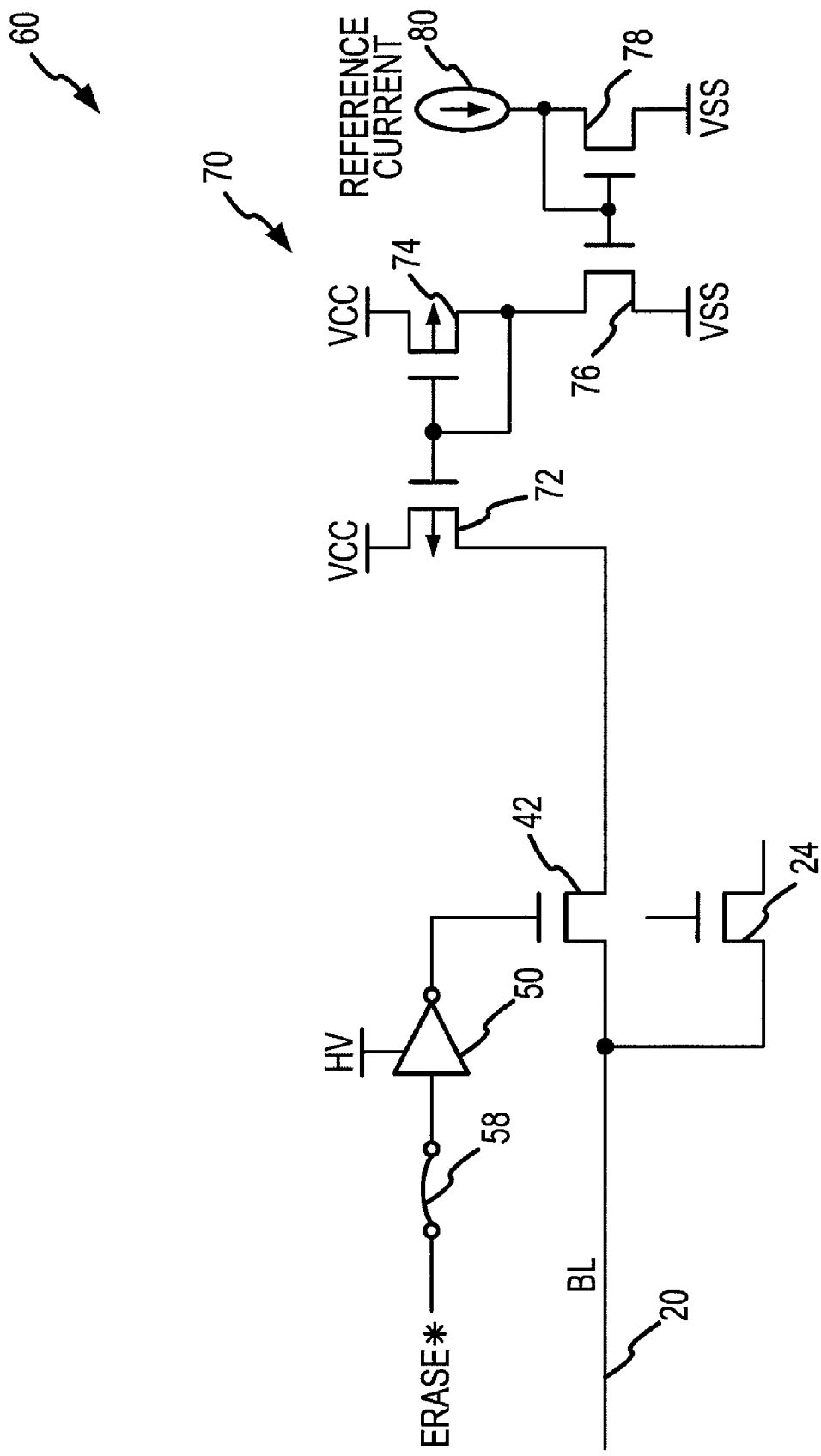
FIG. 4 is a schematic drawing of a power limiting circuit used in the NAND flash memory array of FIG. 1 according to one example of the invention.

A power limiting circuit 60 according to one example of the invention is shown in FIG. 4. The power limiting circuit 60 also includes the inverter 50 powered by the relatively high HV voltage and receiving the ERASE* signal through the fuse or anti-fuse 58. The power limiting circuit 60 also includes the NMOS transistor 42, but the output of the inverter 50 is connected directly to the gate of the transistor 42 rather than through a low-pass filter. Further, instead of being connected to the voltage $V_{CC}$, the drain of the transistor 42 is connected to a current limiting circuit 70.

The current limiting circuit 70 includes a first NMOS transistor 72 connected between a supply voltage $V_{CC}$ and the drain of the transistor 42. The transistor 72 is connected as a current mirror to a second NMOS transistor 74. The drain of the transistor 74 is connected to $V_{CC}$, and the source of the transistor 74 is connected is series with another NMOS transistor 76 that is connected as a second current mirror with an NMOS transistor 78. The NMOS transistor 78 is connected in series with a reference current generator 80 of conventional design.

Figure 5:
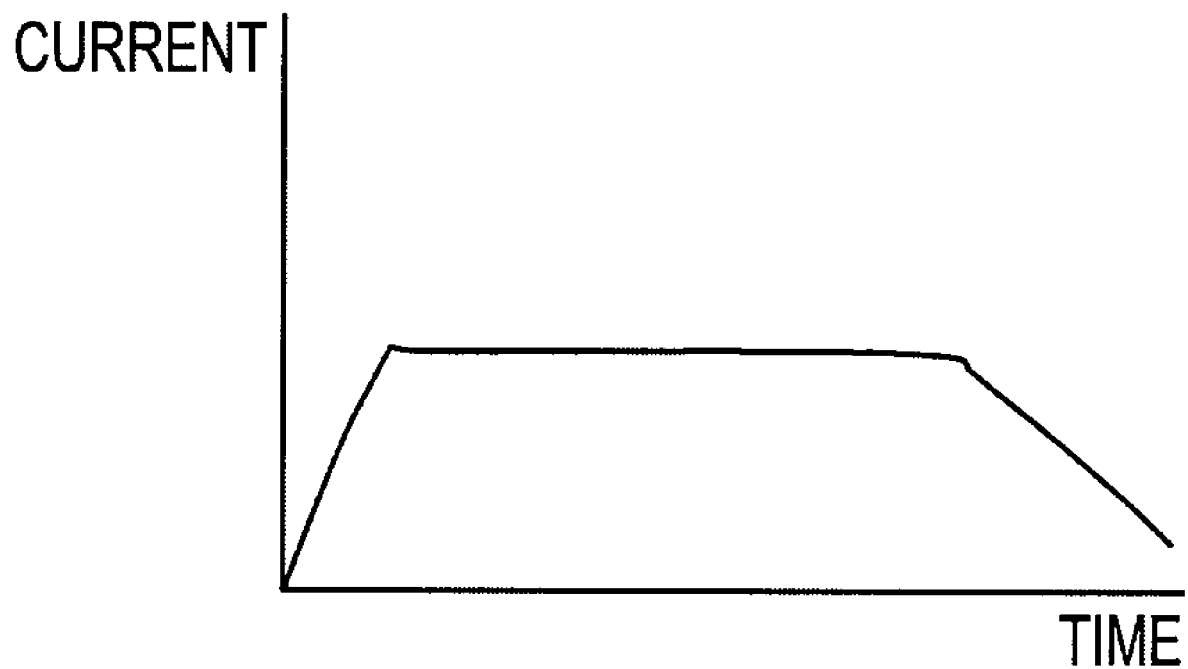
FIG. 5 is a graph showing the bit line current as a function of time provided by the power limiting circuit of FIG. 4.

In operation, the reference current flowing through the transistor 78 is mirrored by the transistor 76 so that the current flowing through the transistor 74 is substantially equal to the reference current. This current is, in turn, mirrored by the transistor 72 when the active low ERASE* signal turns ON the transistor. Therefore, the current drawn by the bit lines BL is limited to the reference current, as shown in FIG. 5. Significantly, the magnitude of the current drawn by the bit lines during programming and/or erase, including erase verification, is not significantly affected by temperature or process variations. Therefore, the power limiting circuit 60 provides good control of the maximum power consumed by a flash memory device during erase and/or programming.

Figure 1:
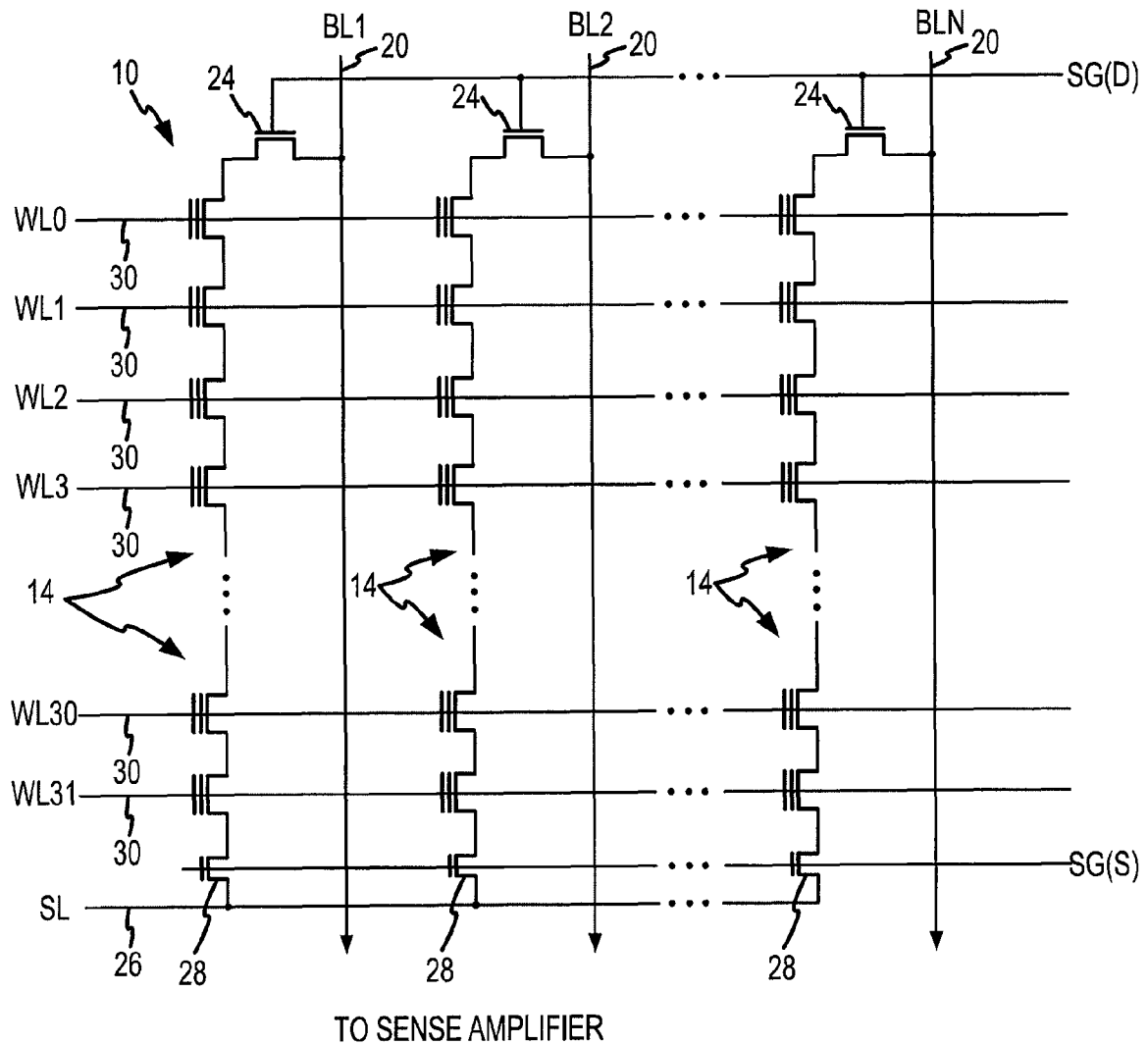
FIG. 1 is a schematic diagram showing a conventional NAND array of flash memory cells.
Figure 2:
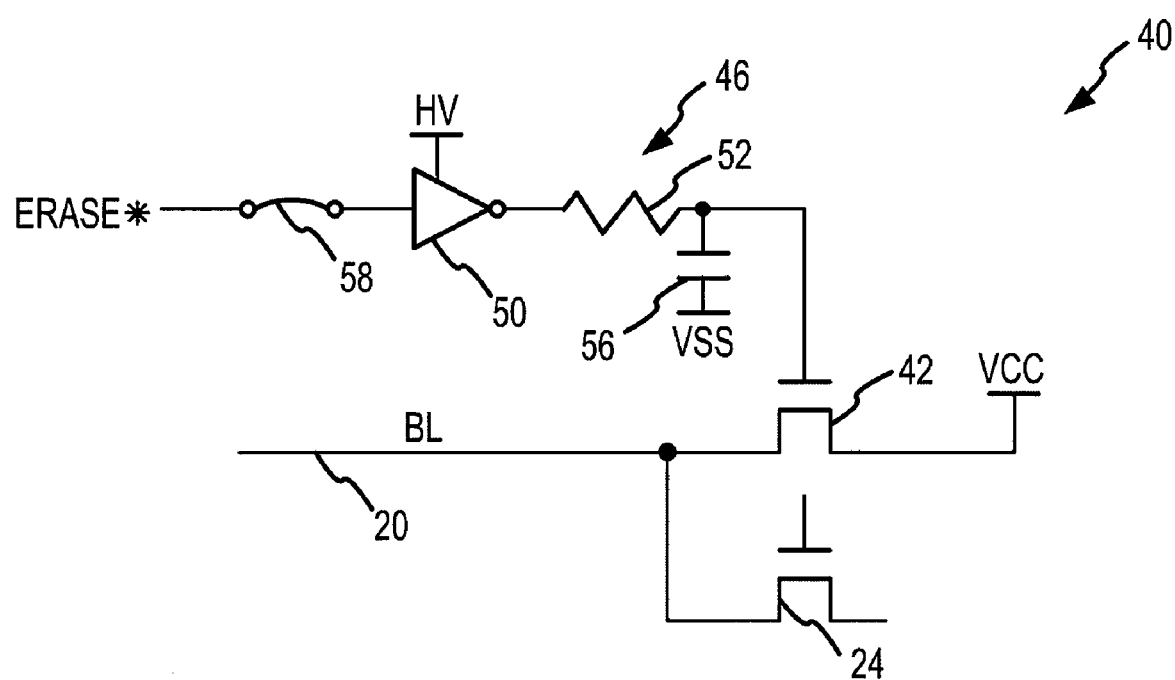
FIG. 2 is a schematic drawing of a conventional power limiting circuit used in the NAND flash memory array of FIG. 1.
Figure 3:
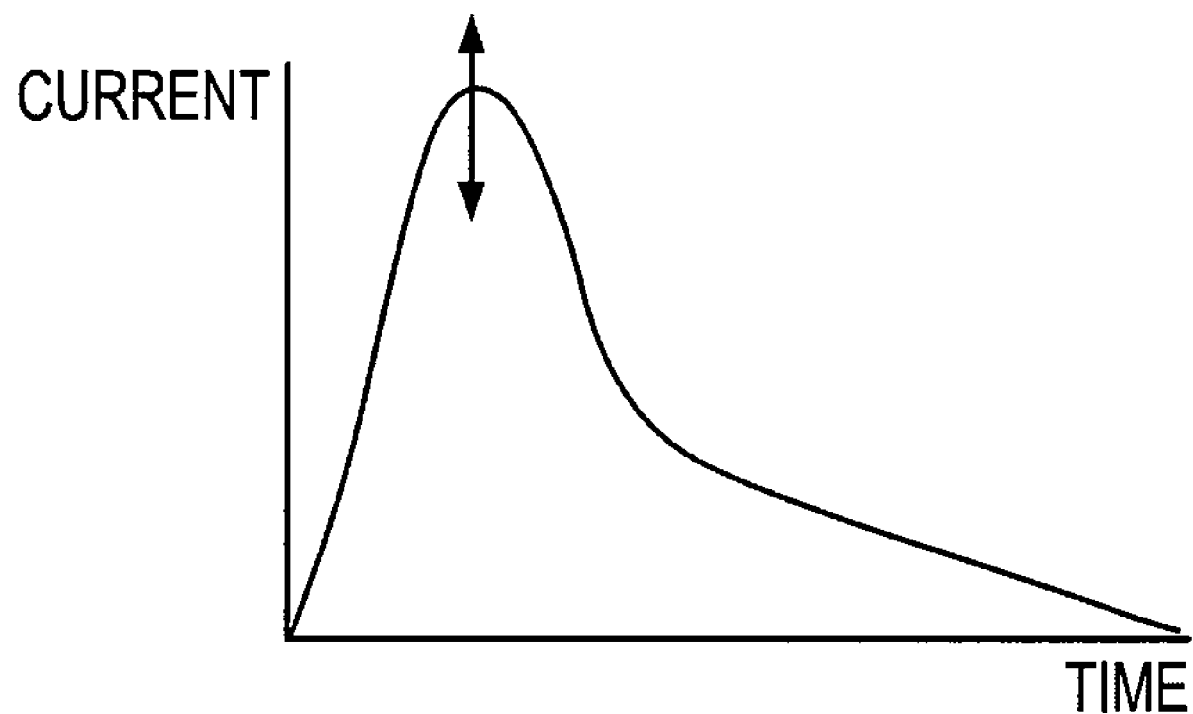
FIG. 3 is a graph showing the bit line current as a function of time provided by the power limiting circuit of FIG. 2.
Figure 6:
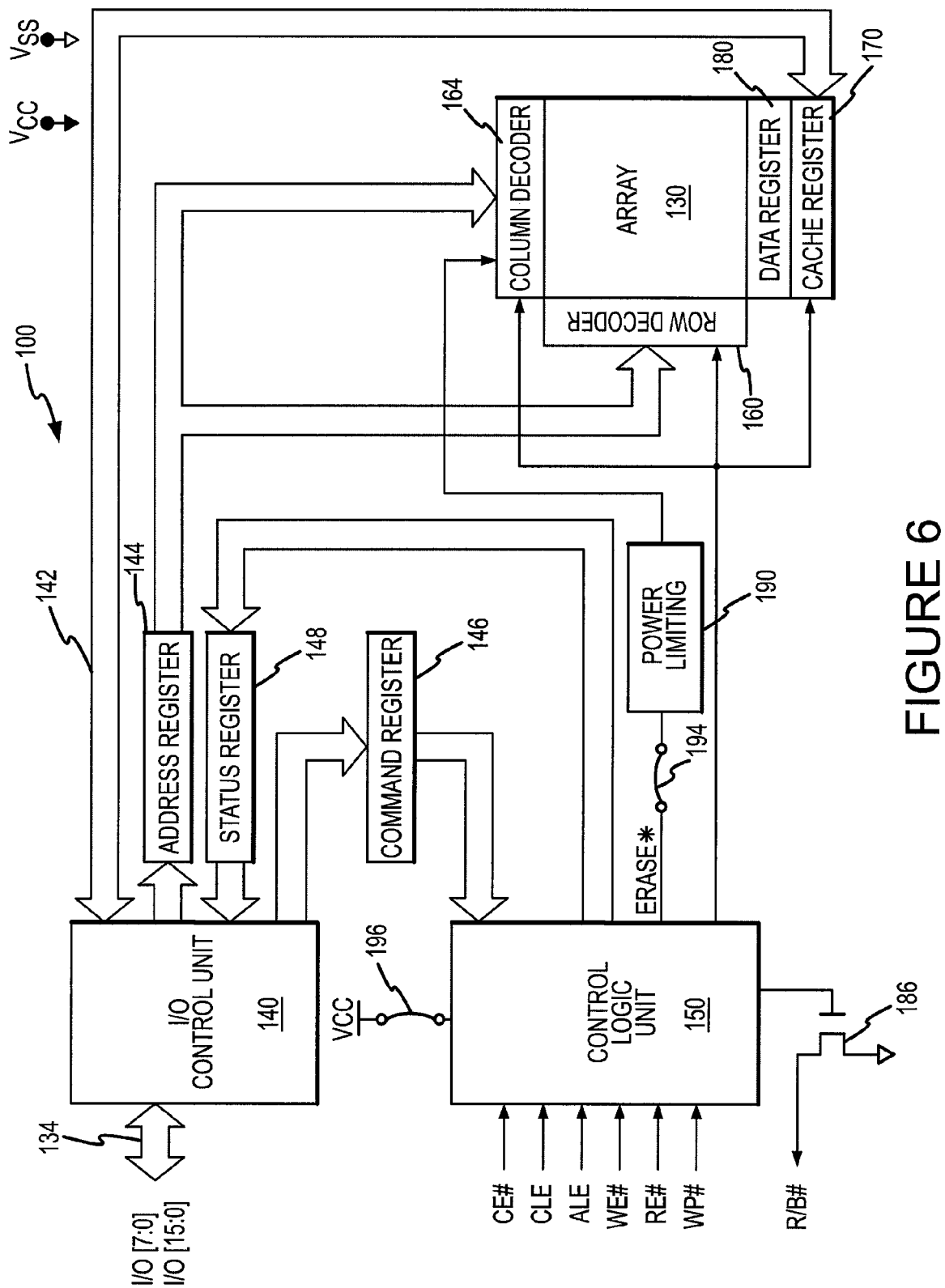
FIG. 6 is a block diagram showing a flash memory device that may uses the power limiting circuit of FIG. 4 or a power limiting circuit according to one another example of the invention.

A flash memory device 100 using the power limiting circuit 60 or a power limiting circuit according to some other example of the invention is shown in FIG. 6. The flash memory device 100 includes an array 130 of flash memory cells arranged in banks of rows and columns. The flash memory cells in the array 130 have their control gates coupled to word select lines, drain regions coupled to local bit lines, and source regions selectively coupled to a ground potential as shown in FIG. 1.

Unlike conventional dynamic random access memory ("DRAM") devices and static random access memory ("SRAM") devices, command, address and write data signals are not applied to the flash memory device 100 through respective command, address and data buses. Instead, most command signals, the address signals and the write data signals are applied to the memory device 100 as sets of sequential input/output ("I/O") signals transmitted through an I/O bus 134. Similarly, read data signals are output from the flash memory device 100 through the I/O bus 134. The I/O bus is connected to an I/O control unit 140 that routes the signals between the I/O bus 134 and an internal data bus 142, an address register 144, a command register 146 and a status register 148.

The flash memory device 100 also includes a control logic unit 150 that receives a number of control signals, including an active low chip enable signal CE#, a command latch enable signal CLE, an address latch enable signal ALE, an active low write enable signal WE#, an active low read enable signal RE#, and an active low write protect WP# signal. When the chip enable signal CE# is active low, command, address and data signals may be transferred between the memory device 100 and a memory access device (not shown). When the command latch enable signal CLE is active high and the ALE signal is low, the control logic unit 150 causes the I/O control unit 140 to route signals received through the I/O bus 134 to the command register 146 responsive to the rising edge of the WE# signal. Similarly, when the address latch enable signal ALE is active high and the CLE signal is low, the I/O control unit 140 routes signals received through the I/O bus 134 to the address register 146 responsive to the rising edge of the WE# signal. The write enable signal WE# is also used to gate write data signals from the memory access device (not shown) to the memory device 100, and the read enable signal RE# is used to gate the read data signals from the memory device 100 to the memory access device (not shown). The I/O control unit 140 transfers the write data signals and read data signals between the I/O bus 134 and the internal data bus 142 when the CLE and ALE signals are both low. Finally, an active low write protect signal WP# prevents the memory device 100 from inadvertently performing programming or erase functions. The control logic unit 150 is also coupled to the internal data bus 142 to receive write data from the I/O control unit for reasons that will be explained below.

The status register 148 can be read responsive to a read status command. After the read status command, all subsequent read commands will result in status data being read from the status register 148 until a subsequent read status command is received. The status data read from the status register 148 provides information about the operation of the memory device 100, such as whether programming and erase operations were completed without error.

The address register 146 stores row and column address signals applied to the memory device 100. The address register 146 then outputs the row address signals to a row decoder 160 and the column address signals to a column decoder 164. The row decoder 160 asserts word select lines 30 (FIG. 1) corresponding to the decoded row address signals. Similarly, the column decoder 164 enables write data signals to be applied to bit lines for columns corresponding to the column address signals and allow read data signals to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the row address signals have been loaded into the address register 146, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire row or page of flash memory cells in the array 130. All of the stored write data signals are then used to program a row or page of memory cells in the array 130 selected by the row address stored in the address register 146. The period of time during which programming voltages are applied to the memory cells in the array 130 is determined by the control logic unit 150. According to one example of the invention, this programming time varies depending on whether the reduced peak power consumption mode is selected. Additionally, the control logic unit 150 determines the period of time during which an erase voltage is applied to the memory cells in the array 130, and this time period also varies depending on whether the reduced peak power consumption mode is selected.

In a manner similar to a write operation, during a read operation, data signals from a row or page of memory cells selected by the row address stored in the address register 146 are stored in a data register 180. Sets of data signals corresponding in size to the width of the I/O bus 134 are then sequentially transferred through the I/O control unit 140 from the data register 180 to the I/O bus 134. Although the array 130 is typically read on a row-by-row or page-by-page basis, a selected portion of a selected row or page may be read by specifying a corresponding column address.

The flash memory device 100 also includes an NMOS transistor 186 having its gate coupled to receive a signal from the control logic unit 150. When the memory device 100 is busy processing a programming, erase or read command, the control logic unit 150 outputs a high signal to cause the transistor 186 to output an active low read/busy signal R/B#. At other times, the transistor 186 is turned OFF to indicate to a memory access device that the device 100 is able to accept and process memory commands.

According to one example of the invention, the memory device 100 includes a power limiting circuit 190 that is coupled to supply erase and/or programming power to the array 130. The power limiting circuit 190 is selectively enabled or disabled by a user blowing a fuse or anti-fuse 194 to control whether or not the control logic unit is able to couple the ERASE* signal to the circuit 190. However, in other embodiments the power limiting circuit 190 is selectively enabled by other means, and in still other embodiments the power limiting circuit 190 is always enabled and is not controllable by a user. A second fuse or anti-fuse 196 is also coupled to the control logic unit 150 so it can increase the erase and/or programming times in a conventional manner when the power limiting circuit 190 is enabled.

Figure 7:
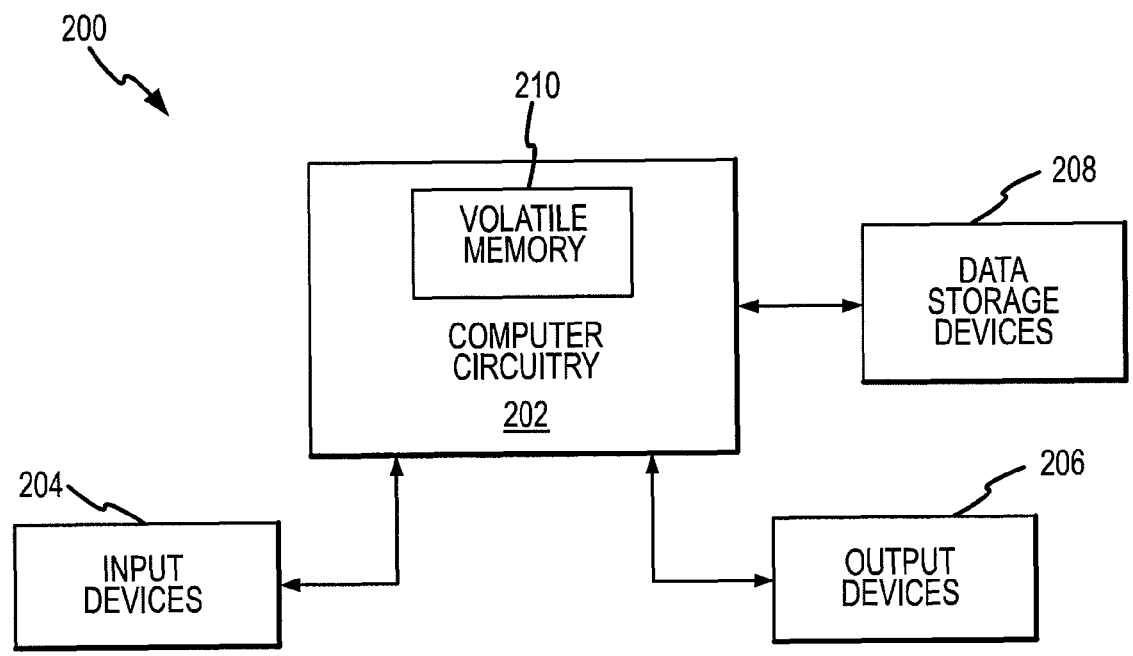
FIG. 7 is a block diagram of a processor-based system using the flash memory device of FIG. 6 or a non-volatile memory device according to another example of the invention.

FIG. 7 is a block diagram of a processor-based system 200 including processor circuitry 202 having a volatile memory 210. The processor circuitry 202 is coupled through address, data, and control buses to the volatile memory 210 to provide for writing data to and reading data from the volatile memory 210. The processor circuitry 202 includes circuitry for performing various processing functions, such as executing specific software to perform specific calculations or tasks. The processor-based system 200 also includes one or more input devices 204 coupled to the processor circuitry 202 to allow an operator to interface with the processor-based system 200. Examples of input devices 204 include keypads, touch screens, and scroll wheels. The processor-based system 200 also includes one or more output devices 206 coupled to the processor circuitry 202 to provide output information to the operator. In one embodiment, the output device 206 is a visual display providing visual information to the operator. A non-volatile data storage device 208 is also coupled to the processor circuitry 202 to store data that is to be retained even when power is not supplied to the processor-based system 200 or to the data storage device 208. The flash memory device 100 or a flash memory device according to another example of the present invention, can be used for the non-volatile data storage device 208.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. A memory device comprising:
a node; and
a power limiting circuit comprising:
a current limiting circuit;
a transistor configured to selectively couple the current limiting circuit to the node, the transistor having a gate; and
an inverter configured to be powered by a voltage and to receive an erase signal through a fuse or an anti-fuse, the inverter having an output coupled to the gate.

2. The memory device of claim 1, wherein the node comprises a bit line.

3. The memory device of claim 1, wherein the transistor is a NMOS transistor.

4. The memory device of claim 1, wherein the output of the inverter is directly coupled to the gate of the transistor.

5. The memory device of claim 1, wherein a drain of the transistor is connected to the current limiting circuit.

6. The memory device of claim 1, wherein the current limiting circuit comprises:
a reference current generator;
a first transistor;
a second transistor;
a third transistor; and
a fourth transistor, the first transistor is connected between a first supply voltage and the transistor configured to selectively couple the current limiting circuit to the bit line, the a second transistor is connected between the first supply voltage and the third transistor, the first transistor is connected as a current mirror to the second transistor, the third transistor is connected between the second transistor and a second supply voltage, the fourth transistor is connected between the reference current generator and the second supply voltage, and the third transistor is connected as a current mirror to the fourth transistor.

7. The memory device of claim 1, wherein the power limiting circuit is configured to be selectively enabled.

8. The memory device of claim 1 wherein the node comprises a bit line, and the memory device further comprises a memory cell and a control logic unit, the control logic unit configured to determine a period of time during which a programming voltage is applied to the memory cell.

9. The memory device of claim 8, wherein the period of time varies depending on whether a reduced peak power consumption mode is selected.

10. The memory device of claim 1 wherein the node comprises a bit line, and the memory device further comprises a memory cell and a control logic unit, the control logic unit configured to determine a period of time during which an erase voltage is applied to the memory cell.

11. The memory device of claim 10, wherein the period of time varies depending on whether a reduced peak power consumption mode is selected.

12. A method of supplying power to memory cells of an array during an operation changing data of at least some of the memory cells of the array, the method comprising:
generating a operating current based on a reference current;
closing a switch to couple the operating current to a bit line to which a memory cells is coupled, the closing of the switch comprising fully activating a transistor in response to an erase signal to couple the operating current to the bit line; and
limiting current to the memory cell in accordance with the operating current.

13. The method of claim 12 wherein generating the operating current comprises mirroring the reference current through at least one current mirror to provide the operating current.

14. The method of claim 12 wherein generating the operating current comprises mirroring the reference current to provide an intermediate current and mirroring the intermediate current to provide the operating current.

15. The method of claim 12 wherein limiting current to the memory cell comprises fully activating a transistor coupling the operating current to the bit line, a magnitude of the operating current limited by the reference current.

16. The method of claim 12, further comprising coupling a supply voltage to the bit line while the switch is closed.

17. A power supply circuit for a memory having at least one memory cell and a control logic unit configured to determine a period of time for an erase operation, the power supply circuit comprising:
   a current generator configured to receive a reference current and further configured to supply current to a bit line for the memory erase operation to erase data stored by the at least one memory cell, a magnitude of the current based on the reference current; and
   a control circuit coupled to the current generator and having a switch coupled between the current generator and the at least one memory cell, the control circuit configured to activate the switch and couple the current from the current generator to the bit line for the at least one memory cell to erase data stored thereby in response to a control signal indicative of performing the memory erase operation.

18. The power supply circuit of claim 17 wherein the current generator comprises a current mirror.

19. The power supply circuit of claim 17 wherein the control circuit comprises:
   an inverter configured to receive the control signal; and
   a transistor having a gate coupled to the inverter and configured to be responsive to an output of the inverter.

20. The power supply circuit of claim 19 wherein the output of the inverter is applied to the gate of the transistor without being filtered.

21. The power supply circuit of claim 17, further comprising a voltage supply configured to provide a supply voltage and wherein the control circuit is further configured to couple the supply voltage to the at least one memory cell in response to the control signal.

22. A memory device comprising:
   a node; and
   a power limiting circuit comprising:
      a current limiting circuit, comprising:
         a reference current generator;
         a first transistor;
         a second transistor;
         a third transistor;
         a fourth transistor, the first transistor is connected between a first supply voltage and a fifth transistor, the a second transistor is connected between the first supply voltage and the third transistor, the first transistor is connected as a current mirror to the second transistor, the third transistor is connected between the second transistor and a second supply voltage, the fourth transistor is connected between the reference current generator and the second supply voltage, and the third transistor is connected as a current mirror to the fourth transistor;
      a fifth transistor configured to selectively couple the current limiting circuit to the bit line, the transistor having a gate; and
      an inverter configured to be powered by a voltage and having an output coupled to the gate of the fifth transistor.

23. The memory device of claim 22 wherein the node comprises a bit line.

24. The memory device of claim 22 wherein the output of the inverter is directly coupled to the gate of the fifth transistor.

25. The memory device of claim 22 wherein a drain of the fifth transistor is connected to the current limiting circuit.

26. The memory device of claim 22 wherein the power limiting circuit is configured to be selectively enabled.

27. The memory device of claim 22 wherein the node comprises a bit line, and the memory device further comprises a memory cell and a control logic unit, the control logic unit configured to determine a period of time during which a programming voltage is applied to the memory cell.

28. The memory device of claim 22 wherein the node comprises a bit line, and the memory device further comprises a memory cell and a control logic unit, the control logic unit configured to determine a period of time during which an erase voltage is applied to the memory cell.

29. A memory device comprising:
   a bit line;
   a memory cell;
   a control logic unit configured to determine a period of time during which a programming voltage is applied to the memory cell, the period of time varying depending on whether a reduced peak power consumption mode is selected; and
   a power limiting circuit comprising:
      a current limiting circuit;
      a transistor configured to selectively couple the current limiting circuit to the bit line, the transistor having a gate; and
      an inverter configured to be powered by a voltage and having an output coupled to the gate.

30. The memory device of claim 29 wherein the output of the inverter is directly coupled to the gate of the transistor.

31. The memory device of claim 29 wherein a drain of the transistor is connected to the current limiting circuit.

32. The memory device of claim 29 wherein the power limiting circuit is configured to be selectively enabled.

33. A memory device comprising:
   a bit line;
   a memory cell;
   a control logic unit configured to determine a period of time during which an erase voltage is applied to the memory cell
   a power limiting circuit comprising:
      a current limiting circuit;
      a transistor configured to selectively couple the current limiting circuit to the bit line, the transistor having a gate; and
      an inverter configured to be powered by a voltage and having an output coupled to the gate.

34. The memory device of claim 33 wherein the output of the inverter is directly coupled to the gate of the transistor.

35. The memory device of claim 33 wherein a drain of the transistor is connected to the current limiting circuit.

36. The memory device of claim 33 wherein the power limiting circuit is configured to be selectively enabled.

37. The memory device of claim 33 wherein the period of time varies depending on whether a reduced peak power consumption mode is selected.

* * * * *

UNITED STATES PATENT AND TRADEMARK OFFICE
CERTIFICATE OF CORRECTION

PATENT NO. : 7,800,953 B2 Page 1 of 1
APPLICATION NO. : 12/505909
DATED : September 21, 2010
INVENTOR(S) : Shigekazu Yamada It is certified that error appears in the above-identified patent and that said Letters Patent is hereby corrected as shown below:

In column 8, line 21, in Claim 6, before "second" delete "a".

In column 9, line 49, in Claim 22, before "second" delete "a".

Signed and Sealed this

Seventh Day of December, 2010

David J. Kappos
*Director of the United States Patent and Trademark Office*